United States Patent [19]

Papathomas

[11] Patent Number: 5,312,887
[45] Date of Patent: May 17, 1994

[54] DICYANATE PREPOLYMERS, USE AND PREPARATION THEREOF

[75] Inventor: Konstantinos I. Papathomas, Endicott, N.Y.

[73] Assignee: International Business Machines Corporation, Armonk, N.Y.

[21] Appl. No.: 987,605

[22] Filed: Dec. 9, 1992

[51] Int. Cl.⁵ .............................................. C08G 73/00
[52] U.S. Cl. ................................ 528/67; 252/182.21; 428/425.6; 428/422.8; 528/289; 560/359
[58] Field of Search .................. 528/67, 289; 524/356, 524/494; 560/359; 428/425.6, 422.8; 252/182.21

[56] References Cited

U.S. PATENT DOCUMENTS

| | | |
|---|---|---|
| 4,518,761 | 5/1985 | Richter et al. ........................ 528/67 |
| 4,740,584 | 4/1988 | Shimp. |
| 4,745,215 | 5/1988 | Cox et al. ........................ 428/422.8 |
| 4,839,442 | 6/1989 | Craig, Jr. . |
| 4,987,272 | 1/1991 | Pigneri ................................ 568/640 |
| 4,999,699 | 3/1991 | Christie et al. . |

OTHER PUBLICATIONS

Research Disclosure: Oct. 1990, Article #31833.

*Primary Examiner*—Veronica P. Hoke
*Attorney, Agent, or Firm*—Pollock, Vande Sande & Priddy

[57] ABSTRACT

Amorphous prepolymers from composition containing bisphenol P dicyanate and bisphenol M dicyanate as well as the cured polymers therefrom are prepared. The prepolymers are especially useful for circuit boards and structural composites.

20 Claims, No Drawings

DICYANATE PREPOLYMERS, USE AND PREPARATION THEREOF

DESCRIPTION

1. Technical Field

The present invention is concerned with amorphous prepolymers of bisphenol dicyanate and bisphenol M dicyanate, as well as the preparation and use thereof. The prepolymers of the present invention when cured are especially suitable as the matrix material for structural composites including printed circuit boards.

2. Background Art

Circuit boards find a wide variety of uses in the electrical industry such as for radios, televisions, appliances, and various electrical apparatus. A widely employed technique for preparing circuit boards is to impregnate a woven fiberglass with a resin composition and then laminate a copper sheet to one or both sides of the resin impregnated fiberglass sheet. Next, an electrical circuit is etched into the copper to form the circuit board and then electrical connections can be soldered to the board when it is used.

Various resins have been suggested for the purpose of impregnating the fiberglass to prepare the circuit boards. For instance, polyimide resins have been used for such purpose. The use of the polyimide resins provides good quality circuit boards which possess high resistance to elevated temperatures, low thermal expansion, and good electrical properties including high electrical resistivity. However, circuit boards prepared from polyimide resins are relatively expensive when compared to circuit boards prepared from epoxy resin impregnated fiberglass sheets. Circuit boards of epoxy resin impregnated fiberglass sheets, although much less expensive than those prepared using polyimide resins, are not especially resistant to high temperatures, have reduced electrical properties and higher thermal expansion when compared to circuit boards of polyimide resin impregnated fiberglass sheets. In addition, other types of resin systems have been suggested for this purpose. For instance, a combination of certain epoxy resins and certain specific bismaleimide materials are suggested in U.S. Pat. Nos. 4,294,877 and 4,294,743.

Moreover, bismaleimide triazine polymeric materials have been suggested as a possible binder or matrix material for printed circuit boards. However, such materials do not form a stable solution in various low boiling point solvents. It is desirable to use low boiling solvents to assist in the rapid application of the resin when attempting to employ such for the purposes of preparing printed circuit boards. One suggestion to prevent such resins from coming out of the solution is to include a solvent such as dimethyl formamide or N-methyl pyrrolidone. Along these lines, see page 11 of High Heat Resistant Polyimide Resin BT Resin Bismaleimide Triazine (the third edition), Mitsubishi Gas Chemical Company, Inc.

More recently, compositions suitable for making circuit boards containing a bismaleimide triazine polymer, a brominated epoxy, and a solvent have been described in U.S. Pat. No. 4,456,712 to Christie et al.

In addition, cyanate esters are generally crystalline solids and not especially soluble in those organic solvents that are desirably used in impregnation processes.

Resin compositions, when cured, should desirably exhibit a relative high glass transition temperature and possess high resistance to elevated temperatures. Accordingly, compositions to be suitable as the matrix material for integrated circuit boards must possess a number of diverse characteristics including relatively high glass transition temperature when cured, solubility and stability in low boiling point solvents, adhesion to the fiberglass sheets, low thermal expansion, and high electrical resistivity.

SUMMARY OF INVENTION

The present invention provides amorphous prepolymers that are soluble in solvents such as methyl ethyl ketone that are widely used and safe for impregnation processes. In addition, the prepolymers of the present invention when cured have high thermal stability and exhibit relatively high glass transition temperatures.

The present invention is concerned with amorphous prepolymers obtained from bisphenol P dicyanate and bisphenol M dicyanate. The present invention is also concerned with crosslinked polymers obtained from curing the prepolymers.

A still further aspect of the present invention is concerned with a process for preparing the amorphous prepolymer which comprises heating a composition containing bisphenol P dicyanate and bisphenol M dicyanate at a temperature and for a time sufficient to trimerize about 5 to 30% of the cyanate groups in the composition.

A still further aspect of the present invention is concerned with a fibrous substrate impregnated with the above desired prepolymer. Moreover, the present invention is concerned with a product of a fibrous substrate impregnated with the prepolymer wherein the prepolymer is cured to a crosslinked polymer.

BEST AND VARIOUS MODES FOR CARRYING OUT INVENTION

As discussed above, cyanate esters are generally crystalline solids. For example, bisphenol P dicyanate ester is insoluble in methyl ethyl ketone which is a widely used and safe solvent for impregnation processes. It has been found pursuant to the present invention that polymers from bisphenol P dicyanate ester and bisphenol M dicyanate ester are soluble in methyl ethyl ketone.

Bisphenol P dicyanate ester (BPD) is represented by the following formula:

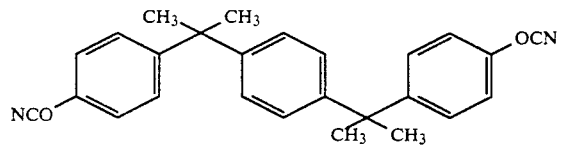

Bisphenol M dicyanate ester (BMD) is represented by the following formula:

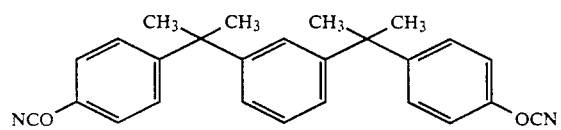

The dicyanate esters useful in this invention are made by reacting a cyanogen halide with the diphenols in the presence of an acid acceptor i.e. base. The method of preparation is known to those skilled in the art and need not be discussed in any detail. The prepolymers are prepared by heating BPD and BMD with or without catalyst at elevated temperatures typically of about 150°-200° C. for a time sufficient to trimerize from about 5 to 45 percent of the —OCN functional groups, which typically takes about 10 to about 90 minutes. It is preferred to conduct the prepolymerization reaction without a catalyst utilizing only heat followed by cooling to room temperature. The extent of the reaction is followed by infrared spectroscopy using the —OCN absorption at 2260 cm$^{-1}$. The prepolymers of this invention are made by reacting the dicyanate ester monomers preferably in the amounts of about 90 to 40 pars by weight of the BMD with about 10 to 60 parts by weight of the BPD monomer. The solubility results for prepolymers of varying amounts of the two esters are shown below in Table 1.

TABLE 1

| % MONOMER FEED | SOLUBILITY (MEK) |
|---|---|
| Bisphenol M dicyante/Bisphenol P dicyante | |
| 100/0 | Soluble |
| 90/10 | Soluble |
| 80/20 | Soluble |
| 70/30 | Soluble |
| 60/40 | Soluble |
| 50/50 | Soluble |
| 40/60 | Soluble |
| 30/70 | Insoluble |
| 0/100 | Insoluble |

The prepolymers of the present invention are preferably employed in the form of compositions containing an organic solvent. The solvent is preferably a low boiling point solvent and most preferably is a ketone such as methyl ethyl ketone. In the preferred aspects of the present invention, the solvent is substantially free, if not entirely free, from solvents other than ketones. The solvent is present in amounts of about 10 to about 70% by weight based upon the total weight of the prepolymer and the solvent present in the composition.

In addition, just prior to use, a catalyst is generally added to the compositions of the present invention to facilitate curing of the compositions. The catalysts employed are of the type that include transition metals. Examples of suitable catalysts include metal salts of carboxylic acids such as salts of octanoic acid, stearic acid and naphthenic acid, including zinc octoate, stannic octoate, zinc naphthenate and cobalt naphthenate; metallic salts of acetylacetone such as ferricacetylacetonate and copper acetylacetonate.

Other catalysts include phenol and other organometallics such as chelates of iron, cobalt, zinc, copper and manganese. The preferred catalyst is zinc octoate. Such catalysts are used in amounts of about 0.001 to about 2.0 parts by weight per 100 parts by weight of the prepolymer. The composition of this invention can be cured by heating at temperatures of less than about 220° C. for sufficient time to produce fully cured products where all —OCN functional groups are reacted. The cured polymers of the present invention exhibit relatively high glass transition temperatures and thermal stability as illustrated in Table 2. The cured composition are particularly useful in circuit boards and structural composites, molded encapsulants, and filmed structural adhesives.

The compositions of the present invention are preferably employed to prepare printed circuit boards. In preparing the boards, the fibrous substrate is impregnated with the prepolymer of the present invention using conventional coating equipment. Subsequent to coating, the impregnated substrate is heat treated at a temperature of about 130° to about 150° C. for about 3 to about 5 minutes to form a nontacky rigid substrate. The compositions can be used to coat and/or impregnate fibrous substrates such as fiberglass, polyimides, graphite, polytetrafluoroethylene and the like.

After the rigid substrate is formed, a sheet of copper or other conductive material can then be laminated to the rigid substrate using laminating conditions such as pressures of about 50 to about 400 pound per square inch and temperatures of about 180° to 250° C. applied for about 60 to about 180 minutes. Then a circuit can be etched into the conductive layer using techniques well-known to form circuit board.

The following non-limiting examples are presented to further illustrate the present invention.

EXAMPLE 1

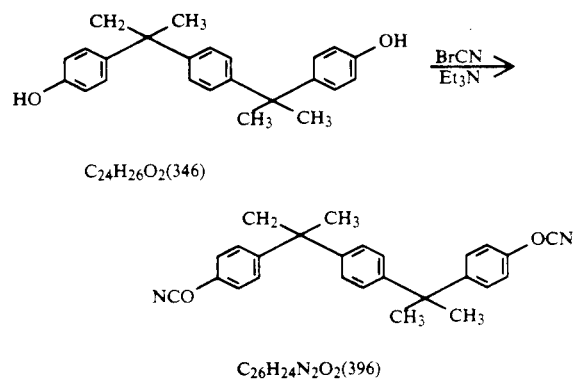

About 34.6 grams (0.1 mol) of bisphenol P and about 300 mol of acetone are combined in a one liter 3-necked round-bottom flask equipped with a low-temperature thermometer, an addition funnel and a mechanical stirrer. About 21.1 grams (0.2 mol) of cyanogen bromide are added all at once and the resulting clear solution is cooled to −10° C. in an ice bath. 20.2 grams (0.2 mol) of triethylamine (Et$_3$N) are added dropwise at such a rate that the temperature of the reaction mixture did not rise above −5° C. After the addition of Et$_3$N is completed, stirring is continued for 30 min; the reaction mixture is then poured into ice-water, with magnetic stirring. The desired dicyanate is precipitated and is removed by filtration, washed with water and dried. Recrystallization from ethyl alcohol afforded about 28 g (70%) of bisphenol P dicyanate.

EXAMPLE 2

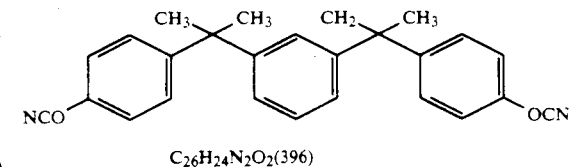

Bisphenol M dicyanate is prepared according to the procedure described for bisphenol P dicyanate. The same quantities are used. The processing is performed as follows: After the addition of the reaction mixture to ice-cold water, a thick syrup separated; this syrup was dissolved in dichloromethane (200 ml), the solution washed with water several times, dried Na$_2$SO$_4$), and concentrated, to afford about 30.3 g (76%) of bisphenol M dicyanate as a very thick syrup.

EXAMPLE 3

The monomers are catalyzed with zinc octanoate (100 ppm Zn metal) by dissolving the bisphenol M dicyanate in methyl ethyl ketone and bisphenol P dicyanate in tetrahydrofluran. Samples are first homogenized and dried under vacuum to remove the solvent. The resulting sticky or viscous liquids are analyzed using Differential Scanning Calorimetry (DSC) giving a glass transition temperature of about 165° C. upon the second scan (0°–300° C.) for the bisphenol M dicyanate and 234° C. for bisphenol P dicyanate. The degradation temperature of both networks exceeds 400° C.

Compositions containing various amounts of these ester monomers upon curing produce networks with glass transition temperatures as shown in Table 2 below:

TABLE 2

| Bisphenol M dicyanate/<br>Bisphenol P dicyanate | Glass Transition<br>Temperature (°C.) |
|---|---|
| 100/0 | 165 |
| 80/20 | 183 |
| 60/40 | 195 |
| 40/60 | 208 |
| 0/100 | 234 |

EXAMPLE 4

Compositions containing 10 to about 70 percent by weight of bisphenol P dicyanate in bisphenol M dicyanate are heated to 180° C. and prereacted for 90 minutes. The resulting products are then tested for solubility in methyl ethyl ketone. Results are shown in Table 1.

What is claimed is:

1. An amorphous prepolymer from a composition containing (a) 1,4-bis (p-hydroxy cumyl) benzene); and (b) 1,3-bis (para hydroxy cumyl) benzene.

2. The prepolymer of claim 1 wherein said composition contains about 10 to about 60 weight % of (a) and corresponding about 40 to about 90 weight % of (b) wherein the weight % are based upon the total of (a) and (b) in the prepolymer.

3. The prepolymer of claim 2 wherein about 5 to about 45 percent of the —OCN functional groups in the composition are trimerized.

4. A composition containing the prepolymer of claim 1 and an organic solvent.

5. The composition of claim 4 wherein said solvent is a ketone.

6. The composition of claim 4 wherein said solvent is methyl ethyl ketone.

7. The composition of claim 6 wherein said prepolymer is from about 10 to about 60 weight % of 1,4-bis (p-hydroxy cumyl) benzene and correspondingly, about 40 to about 90 weight of 1,3-bis (p-hydroxy cumyl) benzene, wherein the weight percents are based upon the total of 1,4-bis (p-hydroxy cumyl) benzene) and 1,3-bis (p-hydroxy cumyl) benzene.

8. The composition of claim 7 which is substantially free from solvents other than methyl ethyl ketone.

9. A process for preparing the amorphous prepolymer of claim 1 which comprises:
obtaining a composition containing (a) 1,4-bis (p-hydroxy cumyl) benzene and (b) 1,3 (p-hydroxy cumyl) benzene;
heating said compositions at a temperature and for a time sufficient to trimerize about 5 to about 45% of the cyanate groups in the composition.

10. The process of claim 9 wherein said composition contains about 10 to about 60 weight percent of (a) and correspondingly about 40 to about 90 weight percent of (b) wherein the weight percents are based upon the total of (a) and (b) in the composition.

11. The process of claim 10 wherein the temperature is about 150° to 180° C.

12. The process of claim 11 wherein the heating is carried out in the absence of a catalyst.

13. A crosslinked polymer from curing the prepolymer of claim 1.

14. The crosslinked polymer of claim 13 wherein the prepolymer contains about 10 to about 60 weight percent of 1,4-bis(p-hydroxy cumyl) benzene and correspondingly about 40 to 90 weight percent of 1,3-bis (p-hydroxy cumyl) benzene, wherein the weight percents are based upon the total of 1,4-bis (p-hydroxy cumyl) benzene and 1,3-bis (p-hydroxy cumyl) benzene in the polymer.

15. A product comprising a fibrous substrate impregnated with a composition containing the prepolymer of claim 1.

16. The product of claim 15 wherein said prepolymer is cured to a crosslinked polymer.

17. The product of claim 15 wherein the prepolymer contains about 10 to about 60 weight percent of 1,4-bis(p-hydroxy cumyl) benzene and correspondingly about 40 to 90 weight percent of 1,3-bis (p-hydroxy cumyl) benzene, wherein the weight percents are based upon the total of 1,4-bis (p-hydroxy cumyl) benzene and 1,3-bis (p-hydroxy cumyl) benzene in the polymer.

18. The product of claim 17 wherein about 5 to about 45 percent of the —OCN functional groups in the composition are trimerized.

19. The product of claim 15 wherein said composition contains a catalyst.

20. The product of claim 15 wherein said prepolymer when cured has a glass transition temperature of at least about 170° C.

* * * * *